(12) United States Patent
Takekida

(10) Patent No.: US 8,427,876 B2
(45) Date of Patent: Apr. 23, 2013

(54) SEMICONDUCTOR STORAGE DEVICE AND CONTROL METHOD THEREOF

(75) Inventor: Hideto Takekida, Nagoya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 13/188,546

(22) Filed: Jul. 22, 2011

(65) Prior Publication Data

US 2012/0020165 A1    Jan. 26, 2012

(30) Foreign Application Priority Data

Jul. 23, 2010    (JP) ................................. 2010-166489

(51) Int. Cl.
*G11C 16/04* (2006.01)
(52) U.S. Cl.
USPC ............ 365/185.18; 356/185.21; 356/185.23; 356/185.17
(58) Field of Classification Search ............. 365/185.18, 365/185.21, 185.23, 185.17
See application file for complete search history.

(56) References Cited

U.S. PATENT DOCUMENTS 7,782,674 B2 *   8/2010   Roohparvar et al. .... 365/185.17
2009/0052242 A1   2/2009   Takekida et al.

FOREIGN PATENT DOCUMENTS

JP    2002-133888    5/2002
JP    2009-193631    8/2009

OTHER PUBLICATIONS

U.S. Appl. No. 13/407,991, filed Feb. 29, 2012, Tekekida.

* cited by examiner

*Primary Examiner* — David Lam
(74) *Attorney, Agent, or Firm* — Oblon, Spivak, McClelland, Maier & Neustadt, L.L.P.

(57) ABSTRACT

In one embodiment, there is provided a semiconductor storage device including: a memory cell array; a high voltage generator; and a controller that controls the high voltage generator. When a word line to is selected from word lines, the controller controls the high voltage generator to: apply a first read pass voltage to one or two first adjacent word lines adjacent to the selected word line; apply a second read pass voltage to a second adjacent word line adjacent to the first adjacent word lines, wherein the second read pass voltage is higher than the first read pass voltage; and apply a third read pass voltage to remaining word lines other than the selected word line, the first adjacent word line and the second adjacent word line, wherein the third read pass voltage is higher than the first read pass voltage and lower than the second read pass voltage.

6 Claims, 11 Drawing Sheets

SEMICONDUCTOR STORAGE DEVICE AND CONTROL METHOD THEREOF

This application claims priority from Japanese Patent Application No. 2010-166489, filed on Jul. 23, 2010, the entire contents of which are hereby incorporated by reference.

BACKGROUND

1. Field

Embodiments described herein generally relates to a semiconductor storage device and a control method of the semiconductor storage device.

2. Description of the Related Art

An EEPROM is a type of nonvolatile semiconductor storage device. In particular, a NAND-type flash memory provides a considerable increase in capacity, and is used as a storage device of an electronic apparatus.

When an operation for reading data from a NAND-type flash memory is performed, a selected cell in a NAND cell unit is applied a read voltage necessary to determine a threshold value distribution thereof. On the other hand, other non-selected cells in the NAND cell unit are each applied a read pass voltage that turns ON the cell irrespective of cell data. After the foregoing voltages have been applied, data is determined based on whether or not a pre-charged bit line is discharged.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

According to exemplary embodiments of the invention, there is provided a semiconductor storage device. The semiconductor device includes: a memory cell array including: a source line arranged in a row direction; a plurality of bit lines arranged in a column direction perpendicular to the row direction; a plurality of cell units arranged in the column direction, each of the cell units including: a memory cell group comprising a plurality of nonvolatile memory cells connected in series in the row direction; a first selection gate transistor connected to one end of the memory cell group such that the memory cell group is connected to a corresponding one of the bit lines; and a second selection gate transistor connected to the other end of the memory cell group such that the memory cell group is connected to the source line; a plurality of word lines arranged in the row direction, wherein control gates of the memory cells of the plurality of cell units, which are arranged in the same line, are connected through a corresponding one of the word lines; a selection gate line, wherein gates of the first or second selection gate transistors of the cell units are connected through the selection gate line; a high voltage generator that generate a high voltage from a supply voltage supplied from outside and provides the high voltage to the respective word lines; and a controller that controls the high voltage generator. When a word line to which a data read voltage is to be applied is selected from the plurality of word lines, the controller controls the high voltage generator to: apply a first read pass voltage to one or two first adjacent word lines adjacent to the selected word line; apply a second read pass voltage to a second adjacent word line adjacent to the first word lines, wherein the second read pass voltage is higher than the first read pass voltage; and apply a third read pass voltage to remaining word lines other than the selected word line, the first adjacent word lines and the second adjacent word line, wherein the third read pass voltage is higher than the first read pass voltage and lower than the second read pass voltage.

Hereinafter, exemplary embodiments of the present invention will be now described with reference to the drawings.

First Exemplary Embodiment

Figure 1:
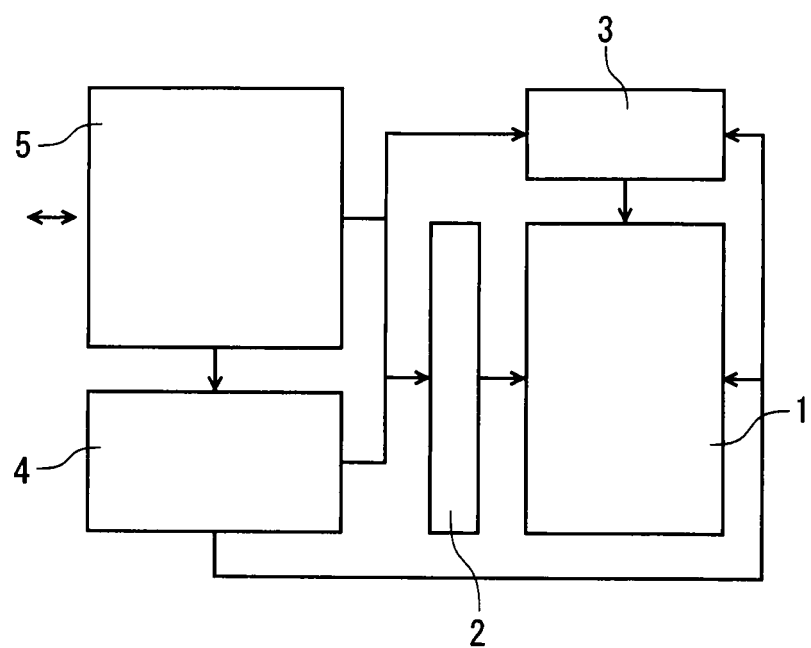
FIG. 1 is a functional block diagram of a NAND-type flash memory according to a first embodiment.

FIG. 1 is a functional block diagram of a NAND-type flash memory according to a first embodiment. In a memory cell array 1, a plurality of memory cells are arranged in an array. A row decoder 2 is provided to selectively drive a word line and a selection gate line which are provided in the memory cell array 1. A column decoder 3 is provided to select a bit line provided in the memory cell array 1.

A high voltage generator 4 is provided to generate a high voltage from a supply voltage supplied from outside when data is read or written from or to the memory cell(s) of the memory cell array 1 or data is erased from the memory cell(s) of the memory cell array 1. A controller 5 is provided to control the row decoder 2, the column decoder 3 and the high voltage generator 4, and to control the memory cell array 1 through the row decoder 2, the column decoder 3 and the high voltage generator 4. Further, the controller 5 is provided to input and output data and command from and to the outside of the NAND-type flash memory.

Figure 2:
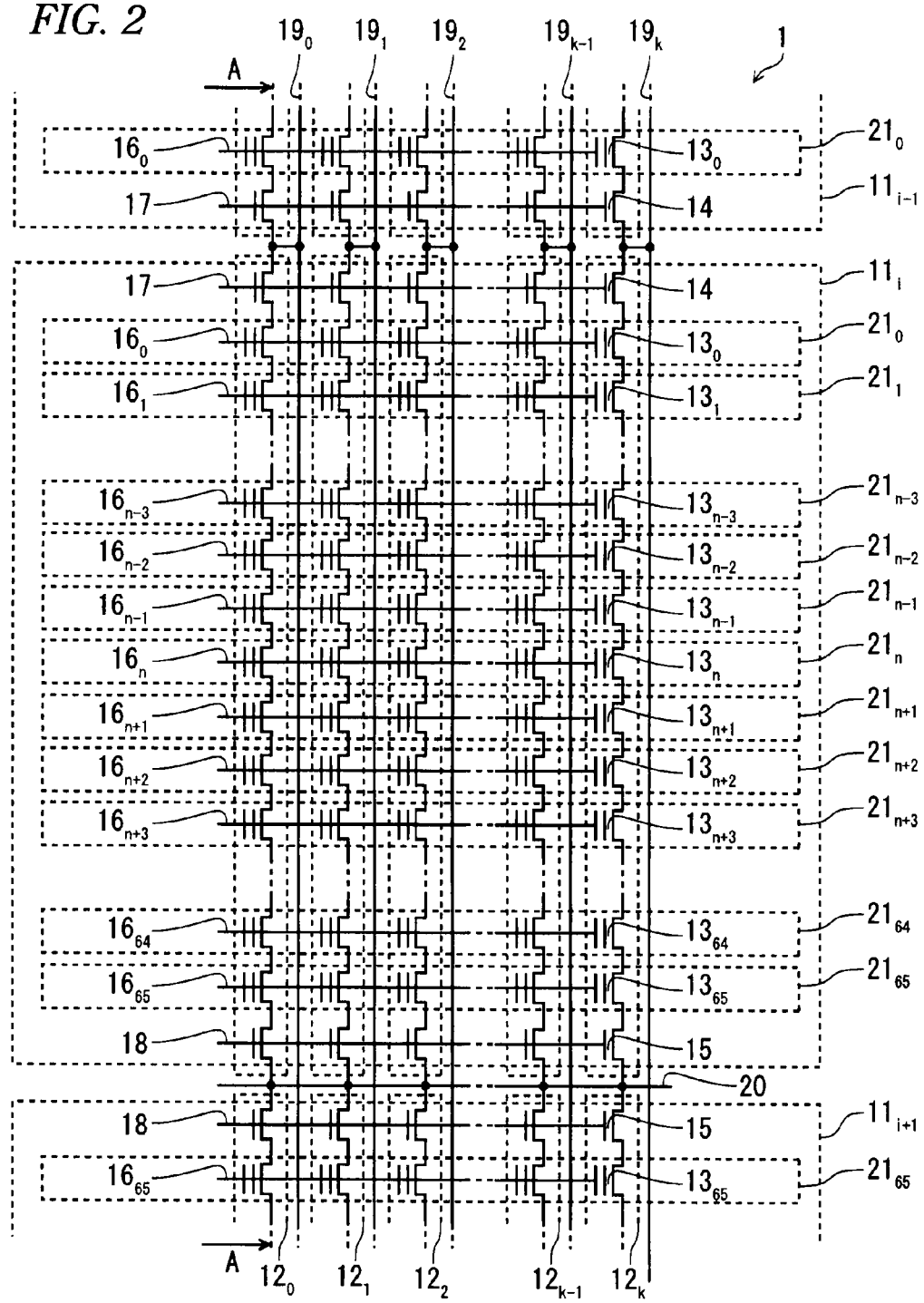
FIG. 2 is a diagram illustrating part of a circuit configuration of a memory cell array.

FIG. 2 is a diagram illustrating part of a circuit configuration of the memory cell array 1. The memory cell array 1 includes a plurality of blocks 11. In FIG. 2, an optional i-th block $11_i$ and part of adjacent blocks $11_{i-1}$ and $11_{i+1}$ are illustrated.

Each block 11 includes a plurality of NAND cell units 12. In each block 11, 0 to k NAND cell units 12 may be provided. For example, k is 4223.

Each NAND cell unit 12 includes a plurality of memory cells 13. The memory cells 13 are provided to store data. In each NAND cell unit 12, for example, 0 to 65 memory cells 13 may be provided. Sources and drains of the memory cells 13 are connected to each other in series. Of the memory cells 13 connected in series, the memory cells located at both ends (memory cells $13_0$ and $13_{65}$ in FIG. 2) may be provided by using dummy cells for storing invalid data.

Each NAND cell unit 12 further includes selection gate transistors 14 and 15. The selection gate transistor 14 is connected in series to a drain-side end of the serially-connected memory cells 13. The selection gate transistor 15 is connected in series to a source-side end of the serially-connected memory cells 13. The NAND cell unit 12 is selected through the selection gate transistors 14 and 15.

Control gates (CGs) of the memory cells 13 are connected to a common one of a plurality of word lines 16. Specifically, of the memory cells 13 arranged in a matrix, the memory cells 13, arranged in a direction (column direction) perpendicular to a direction (row direction) in which the memory cells 13 of the NAND cell unit 12 are connected in series, are connected to the common word line 16.

Accordingly, when the memory cells $13_0$ and $13_{65}$ are connected in series, k+1 memory cells 13 are connected to a common one of 66 word lines 16, i.e., word lines $16_0$ to $16_{65}$, for each block 11.

Each page 21 has a plurality of the memory cells 13 connected to a corresponding one of the word lines $16_0$ to $16_{65}$. Each page 21 includes the memory cells 13, the number of which corresponds to the number of the NAND cell units in each block (which means that each page 21 includes the k+1 memory cells 13 in FIG. 2). Note that when k=4223, 4096 memory cells may be used as storage regions, and 128 memory cells may be used as redundancy regions and other regions.

Gates of the selection gate transistors 14 are connected through a common selection gate line 17. Furthermore, drains of the selection gate transistors 14 are each connected to a corresponding one of bit lines $19_0$ to k.

Gates of the selection gate transistors 15 are connected through a common selection gate line 18. Furthermore, sources of the selection gate transistors 15 are connected to a source line 20. The source line 20 is shared by the blocks adjacent to each other in the row direction. For instance, in the example of FIG. 2, the source line 20 is shared by the blocks $11_i$ and $11_{i+1}$.

Figure 3:
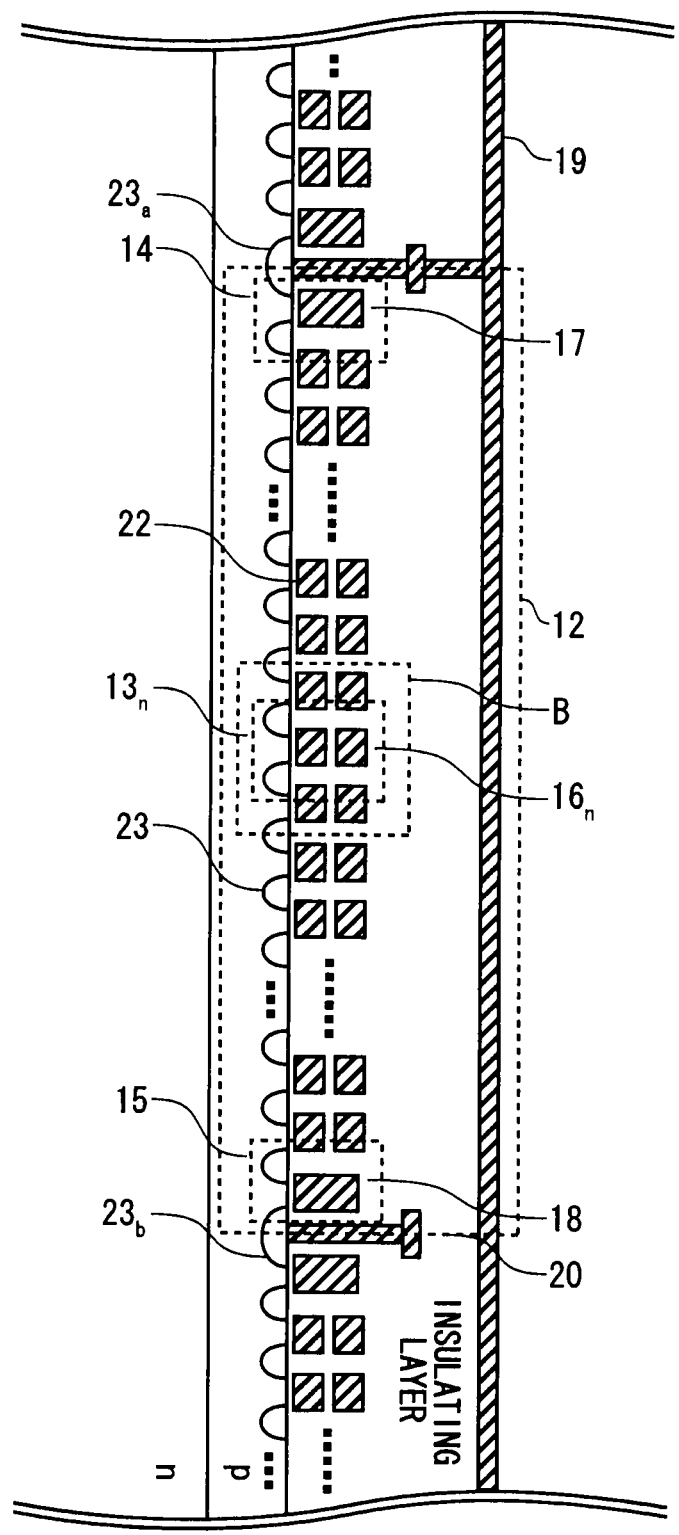
FIG. 3 is a diagram schematically illustrating a structure of a cross section A-A in FIG. 2.

FIG. 3 is a schematic diagram illustrating a structure of a cross section A-A in FIG. 2. Note that in FIG. 3, illustration of regions, which are not directly relevant to the following description, such as front and rear surfaces of a semiconductor storage device, will be omitted.

Each memory cell 13 has a stacked gate structure in which a floating gate (FG) 22 and part of the word line 16 functioning as a CG are stacked and formed over a semiconductor substrate via a dielectric film.

The sources and drains of the memory cells 13 are connected in series via sources and drains 23 shared by the adjacent memory cells 13 and the selection gate transistors 14 and 15. A drain 23a of the selection gate transistor 14 is connected to the bit line 19. A source 23b of the selection gate transistor 15 is connected to the source line 20.

Figure 4:
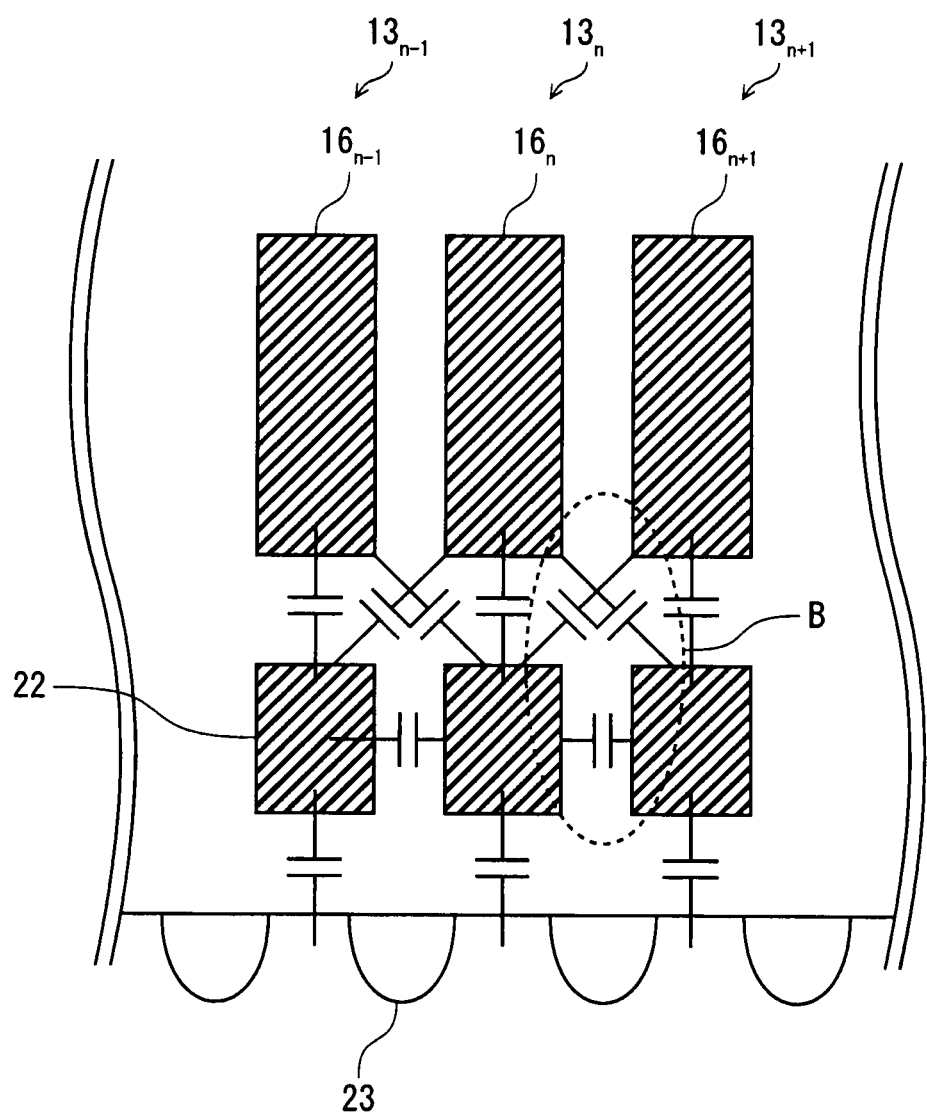
FIG. 4 is an enlarged view schematically illustrating capacity coupling in a B region of FIG. 3.

FIG. 4 is an enlarged view schematically illustrating capacity coupling in a B region of FIG. 3. In this embodiment, n denotes a natural number, and the single selected word line is represented by $16_n$. When data is read, a read voltage $V_{cg}$ is applied to the selected word line $16_n$. As the read voltage $V_{cg}$, a low level voltage (e.g., a voltage of 0.85 V) may be used.

On the other hand, a read pass voltage $V_{read}$ is applied to the word lines $16_{n-1}$ and $16_{n+1}$ (first adjacent word lines) which are adjacent to the selected word line. As the read pass voltage $V_{read}$, a voltage higher than the read voltage (e.g., a voltage of 7 V) may be used.

In this case, due to capacity coupling between the adjacent FGs 22, which has occurred in the B region illustrated in FIG. 4, potentials of the FGs 22 of the adjacent memory cells $13_{n-1}$ and $13_{n+1}$ are reduced. When the potentials of the FGs 22 are reduced, a potential difference between the adjacent word lines $16_{n-1}$ and $16_{n+1}$ tends to increase. Upon increase of the potential difference, electrons are likely to escape from the FGs 22, which tends to make it difficult to retain written data.

Further, if the potentials of the FGs 22 are reduced, it is difficult to turn ON the adjacent memory cells $13_{n-1}$ and $13_{n+1}$ when the read pass voltage $V_{read}$ is applied to the adjacent word lines $16_{n-1}$ and $16_{n+1}$. This might lead to a reduction in electric current flowing through the adjacent memory cells $13_{n-1}$ and $13_{n+1}$, and might degrade reliability (accuracy) of read data.

In particular, when miniaturization of the NAND-type flash memory is advanced, spacing between the word lines 16 is reduced, and therefore, the influence of capacity coupling is increased.

Figure 5:
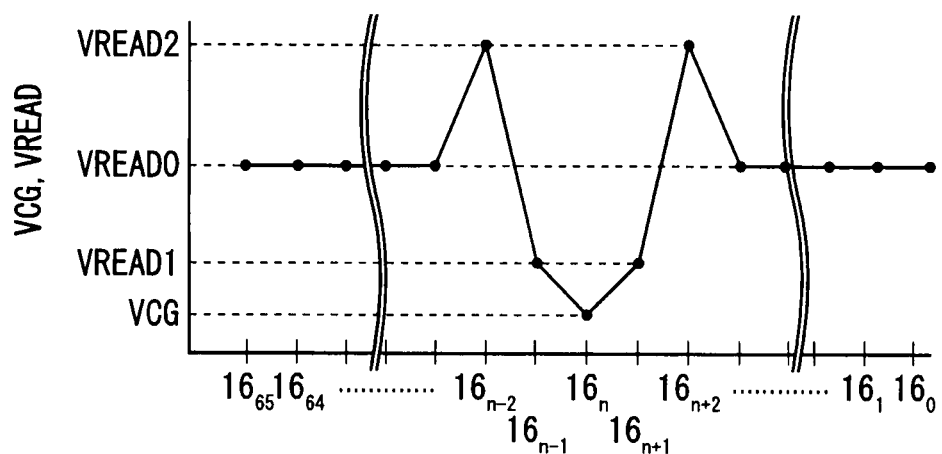
FIG. 5 is a graph illustrating patterns of $V_{cg}$ and $V_{read}$ in the NAND-type flash memory according to the first embodiment.

FIG. 5 is a graph illustrating patterns of $V_{cg}$ and $V_{read}$ applied to the word lines $16_0$ to $16_{65}$. In FIG. 5, a read voltage applied to the selected word line $16_n$ is represented by $V_{cg}$, a read pass voltage (first read pass voltage) applied to the adjacent word lines $16_{n-1}$ and $16_{n+1}$ is represented by $V_{read1}$, a read pass voltage (second read pass voltage), applied to the word lines $16_{n-2}$ and $16_{n+2}$ (second adjacent word lines) located adjacent to the adjacent word lines $16_{n-1}$ and $16_{n+1}$ and opposite to each other with respect to the selected word line $16_n$, is represented by $V_{read2}$, and a read pass voltage (third read pass voltage) applied to the other non-selected word lines 16 is represented by $V_{read0}$.

As illustrated in FIG. 5, the relationship between $V_{cg}$ and $V_{read}$ is as follows: $V_{cg} < V_{read1} < V_{read0} < V_{read2}$. $V_{read0}$ is made higher than $V_{read1}$ ($V_{read1} < V_{read0}$) in order to reduce the potential difference between the FGs 22 of the memory cells $13_{n-1}$ and $13_{n+1}$ and the word lines $16_{n-1}$ and $16_{n+1}$.

Furthermore, $V_{read2}$ is made higher than $V_{read1}$ ($V_{read1} < V_{read2}$) in order to suppress IPD (FG-CG inter-gate dielectric film) leakage by utilizing large capacity coupling of the word lines $16_{n-1}$, $16_{n+1}$, $16_{n-2}$ and $16_{n+2}$.

Moreover, $V_{read2}$ is made higher than $V_{read0}$ ($V_{read0} < V_{read2}$) in order to suppress read disturbance for the other non-selected word lines 16.

Figure 6:
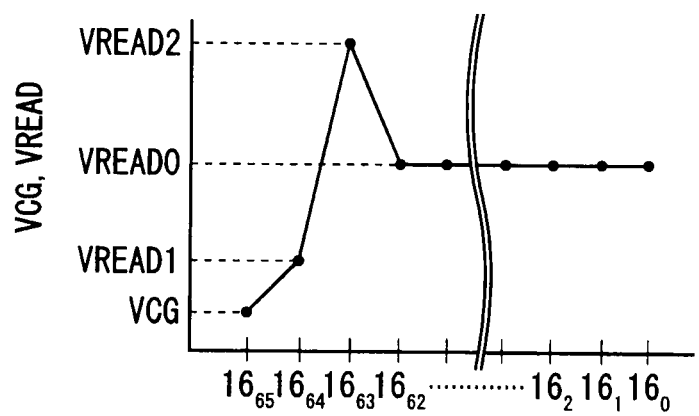
FIG. 6 is a graph illustrating patterns of $V_{cg}$ and $V_{read}$ in the NAND-type flash memory according to the first embodiment.

FIG. 6 is a graph illustrating patterns of $V_{cg}$ and $V_{read}$ when one of the memory cells 13 located at the ends of the NAND cell unit 12 is selected. In this example, FIG. 6 illustrates a case where the memory cell $13_{65}$ is selected for the sake of convenience of description.

In FIG. 6, a read voltage applied to the selected word line $16_{65}$ is represented by $V_{cg}$, a read pass voltage applied to the adjacent word line $16_{64}$ is represented by $V_{read1}$, a read pass voltage, applied to the word line $16_{63}$ located adjacent to the adjacent word line $16_{64}$ and opposite to the selected word line $16_{65}$ with respect to the word line $16_{64}$, is represented by $V_{read2}$, and a read pass voltage applied to the other non-selected word lines 16 is represented by $V_{read0}$.

As illustrated in FIG. 6, similarly to the case where the word line $16_n$ is selected (i.e., the case illustrated in FIG. 5), the relationship between $V_{cg}$ and $V_{read}$ is as follows: $V_{cg} < V_{read1} < V_{read0} < V_{read2}$.

Figure 7:
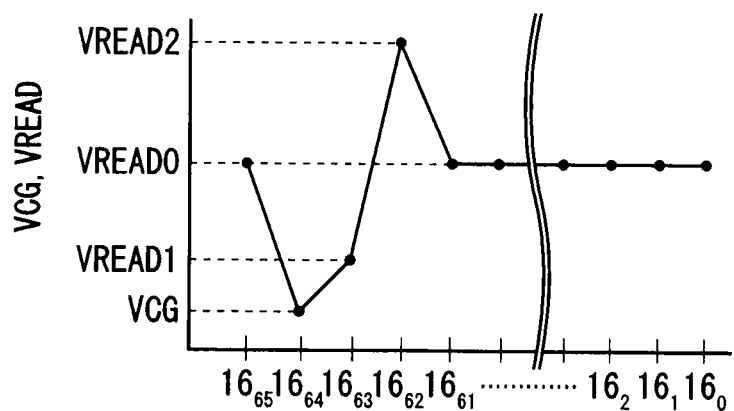
FIG. 7 is a graph illustrating patterns of $V_{cg}$ and $V_{read}$ in the NAND-type flash memory according to the first embodiment.

FIG. 7 is a graph illustrating patterns of $V_{cg}$ and $V_{read}$ when one of the memory cells 13 located adjacent to the memory cells 13 at the ends of the NAND cell unit 12 is selected. In this example, FIG. 7 illustrates a case where the memory cell $13_{64}$ is selected for the sake of convenience of description.

In FIG. 7, a read voltage applied to the selected word line $16_{64}$ is represented by $V_{cg}$, a read pass voltage (fourth read pass voltage) applied to the word line $16_{65}$ adjacent to the selection gate line 18 is represented by $V_{read0}$, a read pass voltage, applied to the adjacent word line $16_{63}$ located closer to the center of the NAND cell unit 12, is represented by $V_{read1}$, a read pass voltage, applied to the word line $16_{62}$ located adjacent to the adjacent word line $16_{63}$ and opposite to the selected word line $16_{64}$ with respect to the word line $16_{63}$, is represented by $V_{read2}$, and a read pass voltage applied to the other non-selected word lines 16 is represented by $V_{read0}$.

As illustrated in FIG. 7, similarly to the case where the word line $16_n$ is selected (i.e., the case illustrated in FIG. 5), the relationship between $V_{cg}$ and $V_{read}$ may be as follows: $V_{cg} < V_{read1} < V_{read0} < V_{read2}$.

In this example, the read pass voltage applied to the adjacent word line $16_{65}$ located at the end of the NAND cell unit 12 is $V_{read0}$ because there is no word line adjacent to the word line $16_{65}$ and thus the foregoing effect of suppressing IPD leakage is unobtainable. Another reason is that since the memory cell $13_{65}$ at the end of the NAND cell unit 12 is a dummy cell, no problem occurs even when $V_{read0}$ is applied.

Figure 8:
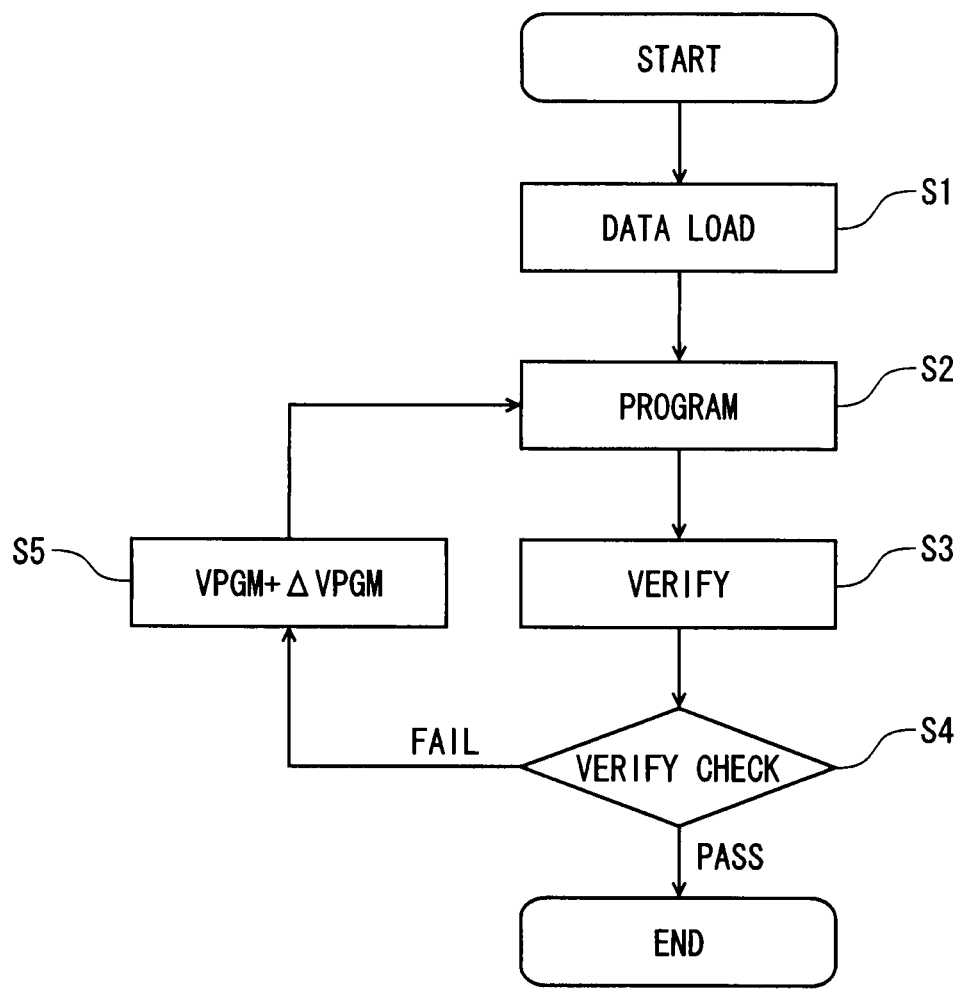
FIG. 8 is a flow chart illustrating operations of the NAND-type flash memory according to the first embodiment.

FIG. 8 is a flow chart illustrating operations of the NAND-type flash memory according to the present embodiment. First, data is loaded from the memory cell 13 in response to a command issued from outside (S1). In this case, $V_{cg}$ and $V_{read}$ applied to the word lines 16 have the relationship described above.

Then, when data needs to be written, data is written to the memory cell 13 (S2). At the point in time when data is written for one page 21, data is loaded from the memory cell 13, to which data has been written in S2, in order to verify whether a written state is sufficient (S3). In this case, $V_{cg}$ and $V_{read}$ applied to the word lines 16 have the relationship described above.

A comparison is made between the data written in S2 and the data loaded in S3 to conduct verification, and the processing sequence ends when there is no difference between the data written in S2 and the data loaded in S3 (i.e., in the case of "Pass" in the flow chart). On the other hand, when there is a difference between the data written in S2 and the data loaded in S3 (i.e., in the case of "Fail" in the flow chart), a write voltage $V_{pgm}$ applied in the preceding step S2 is updated to a voltage increased by $\Delta V_{pgm}$ (S5).

Then, data is rewritten to the memory cell 13 for which a difference has been found (S2). Steps S2 to S5 are repeated until no difference is found in the comparative verification.

Figure 9:
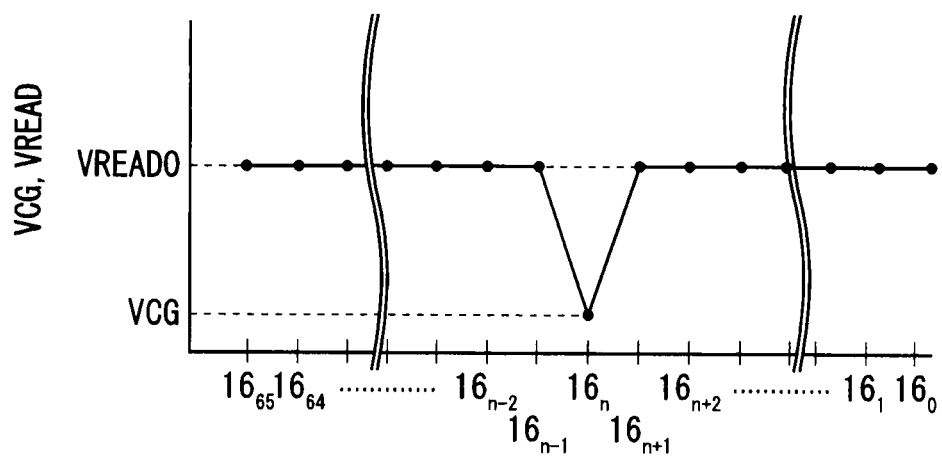
FIG. 9 is a graph illustrating patterns of $V_{cg}$ and $V_{read}$ according to Comparative Example 1.
Figure 10:
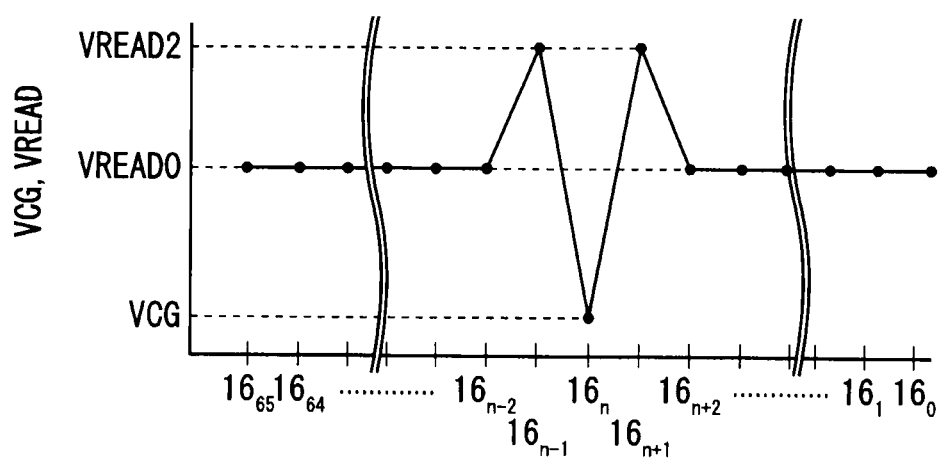
FIG. 10 is a graph illustrating patterns of $V_{cg}$ and $V_{read}$ according to Comparative Example 2.

Referring to FIGS. 9 and 10, comparisons will be made between the present embodiment and comparative examples, and effects of the present embodiment will be described. FIG. 9 is a graph illustrating Comparative Example 1 in which one type of $V_{read}$ voltage is used, and FIG. 10 is a graph illustrating Comparative Example 2 in which two types of $V_{read}$ voltages are used.

In Comparative Example 1, a read pass voltage applied to the non-selected word lines 16 is represented by $V_{read0}$.

In Comparative Example 1, as described with reference to FIG. 4, the potentials of the FGs 22 of the adjacent memory cells $13_{n-1}$ and $13_{n+1}$ are reduced due to capacity coupling. Accordingly, in the NAND-type flash memory according to the present embodiment, written data is more easily retained than Comparative Example 1. Further, reliability of read data is also increased in the NAND-type flash memory according to the present embodiment.

In Comparative Example 2, a read pass voltage applied to the adjacent word lines $16_{n-1}$ and $16_{n+1}$ is represented by $V_{read2}$, and a read pass voltage applied to the other non-selected word lines 16 is represented by $V_{read0}$.

In Comparative Example 2, since $V_{read2} > V_{read0}$, reductions in the potentials of the FGs 22 of the adjacent memory cells $13_{n-1}$ and $13_{n+1}$ can be suppressed as compared with Comparative Example 1. However, a potential difference between the word lines $16_{n-1}$ and $16_{n+1}$ and the FGs 22 of the memory cells $13_{n-1}$ and $13_{n+1}$ is large. Accordingly, in the NAND-type flash memory according to the present embodiment, IPD leakage is more easily suppressed than Comparative Example 2.

Second Exemplary Embodiment

Figure 11:
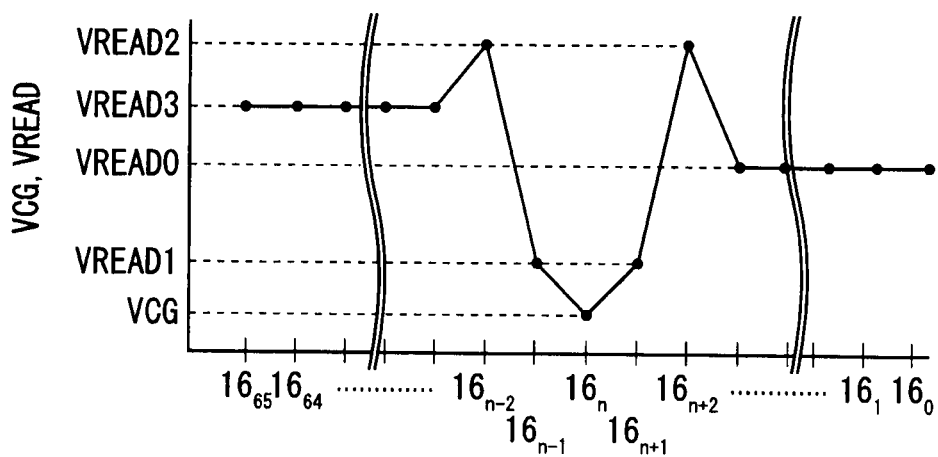
FIG. 11 is a graph illustrating patterns of $V_{cg}$ and $V_{read}$ in a NAND-type flash memory according to a second embodiment.

FIG. 11 is a graph illustrating patterns of $V_{cg}$ and $V_{read}$ applied to word lines $16_0$ to $16_{65}$ in a NAND-type flash memory according to a second embodiment of the present invention. Note that in the second embodiment, constituent elements similar to those of the first embodiment are identified by the same reference characters, and the description thereof will be omitted.

In FIG. 11, a read pass voltage (first read pass voltage) applied to the adjacent word lines $16_{n-1}$ and $16_{n+1}$ is represented by $V_{read1}$, a read pass voltage (second read pass voltage), applied to the word lines $16_{n-2}$ and $16_{n+2}$ (second adjacent word lines) located adjacent to the adjacent word lines $16_{n-1}$ and $16_{n+1}$ and opposite to each other with respect to the selected word line $16_n$, is represented by $V_{read2}$, a read pass voltage (third read pass voltage), applied to the other non-selected word lines 16 serving as the drain side word lines with respect to the selected word line, is represented by $V_{read0}$, and a read pass voltage (fifth read pass voltage), applied to the other non-selected word lines 16 serving as the source side word lines with respect to the selected word line, is represented by $V_{read3}$.

As illustrated in FIG. 11, the relationship between $V_{cg}$ and $V_{read}$ is as follows: $V_{cg} < V_{read1} < V_{read0} < V_{read3} < V_{read2}$. $V_{read3}$ is made higher than $V_{read0}$ ($V_{read0} < V_{read3}$) in order to further reduce resistance values of the memory cells serving as the source side memory cells with respect to the selected memory cell.

In particular, in S3 illustrated in FIG. 8, an enhanced effect is achieved by the following relationship: $V_{read0} < V_{read3}$. This is because data is usually written to the source side memory cells in sequence in a NAND-type flash memory; therefore, since data is not yet written to the memory cells serving as the drain side memory cells with respect to the selected memory cell, resistance of the drain side memory cells is lower than that of the source side memory cells when there exist the memory cells to which data has already been written.

Although the embodiments of the NAND-type flash memories have been described thus far, the present invention is not limited to the foregoing embodiments, and various modifications, additions, substitutions and the like may be made without departing from the scope of the invention.

For instance, in the example illustrated in FIG. 7, the fourth read pass voltage is $V_{read0}$ similarly to the third read pass voltage, but may be any voltage that is equal to or lower than the second read pass voltage and equal to or higher than the third read pass voltage.

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the sprit of the invention. The accompanying

What is claimed is:

1. A semiconductor storage device comprising:
a memory cell array comprising:
  a source line arranged in a row direction;
  a plurality of bit lines arranged in a column direction perpendicular to the row direction;
  a plurality of cell units arranged in the column direction, each of the cell units comprising:
    a memory cell group comprising a plurality of nonvolatile memory cells connected in series in the row direction;
    a first selection gate transistor connected to one end of the memory cell group such that the memory cell group is connected to a corresponding one of the bit lines; and
    a second selection gate transistor connected to the other end of the memory cell group such that the memory cell group is connected to the source line;
  a plurality of word lines arranged in the row direction, wherein control gates of the memory cells of the plurality of cell units, which are arranged in the same line, are connected through a corresponding one of the word lines;
  a selection gate line, wherein gates of the first or second selection gate transistors of the cell units are connected through the selection gate line;
a high voltage generator that generate a high voltage from a supply voltage supplied from outside and provides the high voltage to the respective word lines; and
a controller that controls the high voltage generator,
  wherein when a word line to which a data read voltage is to be applied is selected from the plurality of word lines, the controller controls the high voltage generator to:
  apply a first read pass voltage to one or two first adjacent word lines adjacent to the selected word line;
  apply a second read pass voltage to a second adjacent word line adjacent to the first adjacent word lines, wherein the second read pass voltage is higher than the first read pass voltage; and
  apply a third read pass voltage to remaining word lines other than the selected word line, the first adjacent word lines and the second adjacent word line, wherein the third read pass voltage is higher than the first read pass voltage and lower than the second read pass voltage.

2. The device according to claim 1,
wherein the one or two first adjacent word lines are two first adjacent word lines,
wherein when one of the first adjacent word lines is adjacent to the selection gate line, the controller controls the high voltage generator to apply a fourth read pass voltage to the one of the first adjacent word lines, while applying the first read pass voltage to the other of the first adjacent word lines, wherein the fourth read pass voltage is equal to or lower than the second read pass voltage and equal to or higher than the third read pass voltage.

3. The device according to claim 1,
wherein when one of the remaining word lines is located between the selection gate line connected to the source line and the selected word line, the controller controls the high voltage generator to apply a fifth read pass voltage to said one of the remaining word lines while applying the third read pass voltage to the remaining word lines other than said one of the remaining word lines, wherein the fifth read pass voltage is lower than the second read pass voltage and higher than the third read pass voltage.

4. A control method for a semiconductor storage device, the semiconductor storage device comprising: a memory cell array comprising: a source line arranged in a row direction; a plurality of bit lines arranged in a column direction perpendicular to the row direction; a plurality of cell units arranged in the column direction, each of the cell units comprising: a memory cell group comprising a plurality of nonvolatile memory cells connected in series in the row direction; a first selection gate transistor connected to one end of the memory cell group such that the memory cell group is connected to a corresponding one of the bit lines; and a second selection gate transistor connected to the other end of the memory cell group such that the memory cell group is connected to the source line; a plurality of word lines arranged in the row direction, wherein control gates of the memory cells of the plurality of cell units, which are arranged in the same line, are connected through a corresponding one of the word lines; a selection gate line, wherein gates of the first or second selection gate transistors of the cell units are connected through the selection gate line; a high voltage generator that generate a high voltage from a supply voltage supplied from outside and provides the high voltage to the respective word lines; and a controller that controls the high voltage generator, the control method comprising:
when selecting a word line to which a data read voltage is to be applied from the plurality of word lines,
  (a) applying a first read pass voltage to one or two first adjacent word lines adjacent to the selected word line;
  (b) applying a second read pass voltage to a second adjacent word line adjacent to the first word lines, wherein the second read pass voltage is higher than the first read pass voltage; and
  (c) applying a third read pass voltage to remaining word lines other than the selected word line, the first adjacent word lines and the second adjacent word line, wherein the third read pass voltage is higher than the first read pass voltage and lower than the second read pass voltage.

5. The method according to claim 4, wherein the one or two first adjacent word lines are two first adjacent word lines, the method further comprising:
when one of the first adjacent word lines is adjacent to the selection gate line,
  (d) applying a fourth read pass voltage to the one of the first adjacent word lines, while applying the first read pass voltage to the other of the first adjacent word lines, wherein the fourth read pass voltage is equal to or lower than the second read pass voltage and equal to or higher than the third read pass voltage.

6. The method according to claim 4 further comprising,
when one of the remaining word lines is located between the selection gate line connected to the source line and the selected word line,
  (d) applying a fifth read pass voltage to said one of the remaining word lines while applying the third read pass voltage to the remaining word lines other than said one of the remaining word lines, wherein the fifth read pass voltage is lower than the second read pass voltage and higher than the third read pass voltage.

* * * * *